United States Patent
Fujita (10) Patent No.: US 8,468,687 B2
(45) Date of Patent: Jun. 25, 2013

(54) COMPONENT MOUNTING APPARATUS

(75) Inventor: Masatoshi Fujita, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 0 days.

(21) Appl. No.: 13/076,935

(22) Filed: Mar. 31, 2011

(65) Prior Publication Data

US 2011/0258848 A1    Oct. 27, 2011

(30) Foreign Application Priority Data

Apr. 26, 2010    (JP) .................. 2010-101123

(51) Int. Cl.
*B23P 19/00*    (2006.01)

(52) U.S. Cl.
USPC ........... 29/740; 29/739; 29/741; 29/742; 29/705; 700/110

(58) Field of Classification Search
USPC ........... 29/729, 739, 740–742, 705, 719–721; 700/121, 100–111; 414/752.1–752.7
See application file for complete search history.

(56) References Cited

U.S. PATENT DOCUMENTS

| | | | | |
|---|---|---|---|---|
| 5,588,195 A | * | 12/1996 | Asai et al. | 29/33 M |
| 6,634,092 B1 | * | 10/2003 | Iwasaki | 29/740 |
| 7,458,147 B2 | * | 12/2008 | Kawase et al. | 29/833 |
| 7,777,445 B2 | * | 8/2010 | Uchiyama et al. | 320/101 |
| 2007/0124922 A1 | * | 6/2007 | Kawasumi et al. | 29/739 |
| 2008/0163480 A1 | * | 7/2008 | Kawasumi et al. | 29/740 |
| 2011/0258848 A1 | * | 10/2011 | Fujita | 29/739 |

FOREIGN PATENT DOCUMENTS

| JP | 2001-37080 | 2/2001 |
|---|---|---|
| JP | 2008-311476 | 12/2008 |

* cited by examiner

*Primary Examiner* — Minh Trinh
(74) *Attorney, Agent, or Firm* — Oblon, Spivak, McClelland, Maier & Neustadt, L.L.P.

(57) ABSTRACT

In a component mounting apparatus, a picking member picks components and mounts them on a board through movements of a plurality of moving members driven by motors. The apparatus is provided with a regenerative electric power control section for controlling regenerative electric power produced by regenerating a motion energy when each of the motors is decelerated; power supply sections for the motors each for exchanging electric power with the regenerative electric power control section; and a control section. When two moving members are moved, the control section begins to start and accelerate one of the two moving members in synchronized relation with a timing of beginning to decelerate and stop the other moving member and controls the regenerative electric power control section to utilize a regenerative electric power which is obtained from the motor driving the other moving member, in starting the motor which drives the one moving member.

4 Claims, 4 Drawing Sheets

COMPONENT MOUNTING APPARATUS

INCORPORATION BY REFERENCE

This application is based on and claims priority under 35 U.S.C. 119 with respect to Japanese Application No. 2010-101123 filed on Apr. 26, 2010, the entire content of which is incorporated herein by reference.

BACKGROUND OF THE INVENTION

1. Field of the Invention

The present invention relates to a component mounting apparatus for mounting a large number of components such as, typically, electronic components, and more particularly, it relates to a component mounting apparatus oriented to energy-saving.

2. Discussion of the Related Art

As equipments for producing boards with a large number of components mounted thereon, there are screen printer, component mounting apparatus, reflow soldering and the like, and it is often the case that these machines are connected by transfer devices to construct a board production line. Of these machines, component mounting apparatuses are provided with a component mounting head (component picking member) for picking components from a component supply device to mount the components on a board and a head drive mechanism for driving the component mounting head. The head drive mechanism is provided with two horizontally movable members which are respectively movable in two orthogonal directions for moving the component mounting head to desired positions over the component supply device as well as over the board. Further, the head drive mechanism is provided with a vertical movable member for vertically moving the component mounting head to draw and mount components. Further, it is conventional that respective motors are provided and are controlled by a control section to drive the three moving members independently.

In component mounting apparatuses of this kind, the moving speed of each moving member has been increased more and more for high production efficiency and reduction in the time taken. Further, shortening the moving time has been sought in such a way that the component mounting head is not moved to turn sharply at right angles but is moved to draw a curve locus called "arch motion". In a mounting component mounting device disclosed by the present assignee in JP 2008-311476 A, the device in an embodiment is provided with an X-axis slider and a Y-axis slider to enable free movements in a horizontal plane. Further, a nozzle holder (component mounting head) is able to perform the rotational (R-axis) motion and the vertical (Z-axis) motion as simultaneous operations (overlap operation). In such position control and posture control, a control section performs a control that it decelerates and stops a certain motor while starting and accelerating another motor.

In recent years, a preventive measure against the global warming has become an important theme which is to be attacked not only in a board production industry but also in all of the industrial world. An energy recycling method disclosed in JP 2001-37080 A takes managing regenerative energy in a group of machines as a solution to the problem of reducing the energy consumption in the whole of a factory. Further, as specific measures. there is disclosed a DC common link which makes a common connection of direct current power supplies for servo-driver units of the respective machines. Also in component mounting apparatuses, not only the aspect of production efficiency but also the aspect of energy-saving tends to be recognized as one item for performance evaluation. Accordingly, it is required to cope with the reduction in carbon dioxide emission by developing a component mounting apparatus which is of being as energy-saving as possible.

However, in the prior art component mounting apparatus exemplified in the first-mentioned Japanese application, the regenerative electric power which is generated when a motor is decelerated and stopped has been wasted by being converted into heat at regenerative resistances provided in a power supply section. That is, the regenerative electric power has not been utilized usefully and effectively, which is unfavorable from the viewpoint of energy-saving. On the other hand, the energy recycling method disclosed in the second-mentioned Japanese application is a technology which covers machine groups throughout the factory, and therefore, is difficult to use in the form specialized in utilizing regenerative electric power in a component mounting apparatus.

Further, in component mounting apparatuses, the vibration occurring on a base increases with an increase in the moving speed of each moving member. Moreover, where a plurality of moving members are simultaneously accelerated in the same direction, the reaction acting on the base is doubled to further increase the vibration. The increase in vibration is liable to affect the operation accuracy of the component mounting apparatus and hence, may give rise to a problem that causes a deterioration in accuracy of the boards produced by the apparatus.

SUMMARY OF THE INVENTION

Accordingly, it is an object of the present invention to provide an improved component mounting apparatus which is capable of reducing the power consumption in comparison with the prior art apparatus by effectively utilizing the regenerative electric power which is generated when motors installed are decelerated and stopped and also capable of suppressing vibration which is generated during operations.

Briefly, according to the present invention in a first aspect, there is provided a component mounting apparatus which has a plurality of moving members movably interposed between a component picking member for picking a component and a base and respectively driven by motors for enabling the component picking member to pick the component from a component supply device and to mount the component on a board positioned at a component mounting position. The apparatus comprises a regenerative electric power control section for controlling regenerative electric power which is produced by regenerating a motion energy when each of the electric motors is decelerated; and power supply sections for the respective motors each for exchanging electric power with the regenerative electric power control section. The apparatus further comprises a control section being operable where two moving members of the plurality of moving members are moved, for beginning to start and accelerate one of the two moving members in synchronized relation with a timing of beginning to decelerate and stop the other moving member or with a predetermined timing in the deceleration of the other moving member and for controlling the regenerative electric power control section to utilize a regenerative electric power which is obtained from the motor driving the other moving member at the time of the deceleration, in starting the motor which drives the one moving member so as to start and accelerate the one moving member.

With this construction in the first aspect, the component mounting apparatus is provided with the moving members, the motors and the power supply sections for moving the component picking member and is further provided with the regenerative power supply control section for controlling the regenerative electric power which is produced when each motor is decelerated, and the control section for controlling the regenerative power supply control section while detecting the position or the moving speed of each moving member. Thus, where two moving members are moved, the control section begins to start and accelerate one of the two moving members in synchronized relation with a timing of beginning to decelerate and stop the other moving member or with a predetermined timing in the deceleration of the other moving member and also performs a control operation to utilize the regenerative electric power which is obtained from the motor driving the other moving member, in starting the motor which drives the one moving member. Accordingly, it is possible to make effective use of the regenerative electric power which has been disregarded in the prior art apparatus, and hence, it is possible to reduce the electric power consumed by the component mounting apparatus. In this case, since the production and utilization of the regenerative electric power are performed concurrently, there is not required an electricity accumulator for storing the regenerative electric power.

According to the present invention in a second aspect, there is provided a component mounting apparatus having a plurality of component transfer devices, wherein each of the component transfer devices is provided with first, second and third moving members which are interposed between a component picking member for picking a component and a base and which are respectively driven by a first motor in a first horizontal direction, a second motor in a second horizontal direction and a third motor in a vertical direction for enabling the component picking member to pick the component from a component supply device and to mount the component on a board positioned at a component mounting position. The apparatus comprises a regenerative electric power control section for controlling regenerative electric power which is produced by regenerating a motion energy when each of the electric motors is decelerated; and power supply sections for the respective motors each for exchanging electric power with the regenerative electric power control section. The apparatus further comprises a control section being operable where two moving members of the plurality of moving members are moved in either one of the first horizontal direction, the second horizontal direction and the vertical direction, for beginning to start and accelerate one of the two moving members in synchronized relation with a timing of beginning to decelerate and stop the other moving member or with a predetermined timing in the deceleration of the other moving member and for controlling the regenerative electric power control section to utilize a regenerative electric power which is obtained from the motor driving the other moving member at the time of the deceleration, in starting the motor which drives the one moving member so as to start and accelerate the one moving member.

With the construction in the second aspect, the component mounting apparatus has the plurality of component transfer devices, wherein each of the component transfer devices is provided with the component picking member, the first to third moving members, the first to third motors and the power supply sections for the respective motors. The apparatus further has the regenerative electric power control section for controlling the regenerative electric power which is produced when each motor is decelerated, and the control section for controlling the regenerative power supply control section while detecting the position or the moving speed of each moving member. Thus, where two moving members are moved in the same direction, the control section begins to start and accelerate one of the two moving members in synchronized relation with a timing of beginning to decelerate and stop the other moving member or with a predetermined timing in the deceleration of the other moving member and also performs a control operation to utilize a regenerative electric power which is obtained from the motor driving the other moving member, in starting the motor which drives the one moving member. Accordingly, it is possible to make effective use of the regenerative electric power which has been disregarded in the prior art apparatus, and hence, it is possible to reduce the electric power consumed by the component mounting apparatus. In addition, since the deceleration of the other moving member and the starting and acceleration of the one moving member in the same direction are carried out to overlap each other, the reaction forces which the both moving members exert on the base becomes opposite in direction to cancel at least parts of the reaction forces, so that the vibration generated therein can be suppressed.

Preferably, in the component mounting apparatus in each of the first and second aspects, the control section performs a harmonization control to synchronize the deceleration timing of the other moving member with the acceleration timing of the one moving member or to make the deceleration of the other moving member and the acceleration of the one moving member become approximately equal amounts or strengths with opposite signs of plus and minus. Thus, by the synchronization of the deceleration timing with the acceleration timing, it is possible to make effective utilization of the regenerative electric power reliably without providing an electricity accumulator. Moreover, where the deceleration of the other moving member and the acceleration of the one moving member are controlled to become approximately equal amounts or strengths with opposite signs of plus and minus, it is possible to effectively utilize the most part of the regenerative electric power, so that the efficiency in utilizing the regenerative electric power can be enhanced remarkably.

Further preferably, in the component mounting apparatus in each of the first and second aspects or that in the modified form of the character set forth above, an electricity accumulation section being capable of storing the electric power is further provided to be connected to the regenerative electric power control section. Thus, where a time difference exists between the deceleration of the other moving member and the acceleration of the one moving member, or where the regenerative electric power obtained from the deceleration is greater than the drive electric power required for the starting and acceleration, the whole or a part of the regenerative electric power can be stored temporarily and can be effectively used later. Further, it becomes unnecessary to concurrently perform the producing and utilization of the regenerative electric power, so that the freedom of controlling the respective moving members can be increased.

According to the present invention in a third aspect, there is provided a component mounting apparatus which has a plurality of moving members movably interposed between a component picking member for picking a component and a base and respectively driven by motors for enabling the component picking member to pick a component from a component supply device and to mount the component on a board positioned at a component mounting position. The apparatus comprises a regenerative electric power control section for controlling regenerative electric power which is produced by regenerating a motion energy when each of the electric motors is decelerated; and brake sections being operable by electric power for braking the respective moving members. The apparatus further comprises a control section being operable when detecting a beginning to decelerate and stop one of the moving members, for starting the operation of the brake section for the one moving member and for controlling the regenerative electric power control section to utilize a regenerative electric power which is obtained from the motor driving the one moving member at the time of the deceleration, for the operation of the brake device for the one moving member.

With the construction in the third aspect, the component mounting apparatus is provided with the plurality moving members and the motors for moving the component picking member and the brake sections being operable by electric power for braking the respective moving members and is further provided with the regenerative electric power control section for controlling the regenerative electric power which is produced when each motor is decelerated, and the control section for controlling the regenerative electric power control section while detecting the movement of each moving member. Thus, when detecting the beginning to decelerate and stop one of the moving members, the control section is able to start the operation of the brake device for the one moving member and to utilize the regenerative electric power obtained from the deceleration for the operation of the brake device for the one moving member. Accordingly, it is possible to make effective utilization of the regenerative electric power which is obtained from the deceleration of the moving member, and hence, it is possible to reduce the electric power consumed by the component mounting apparatus in comparison with that in the prior art apparatus. Moreover, since the regenerative electric power is fed back to be utilized for the operation of the brake section, the performance in the deceleration and stopping can be enhanced.

Preferably, in the component mounting apparatus in the third aspect, each brake section is configured to use an electro rheological fluid or a magnetic fluid. Thus, it is possible to effectively utilize the regenerative electric power which is obtained from the deceleration of each moving member, for stimulating the electro rheological fluid or the magnetic fluid. Accordingly, it is possible to decelerate and stop the moving member powerfully and efficiently by the action of the electro rheological fluid or the magnetic fluid so stimulated.

BRIEF DESCRIPTION OF THE ACCOMPANYING DRAWINGS

The foregoing and other objects and many of the attendant advantages of the present invention may readily be appreciated as the same becomes better understood by reference to the preferred embodiments of the present invention when considered in connection with the accompanying drawings, wherein like reference numerals designate the same or corresponding parts throughout several views, and in which.

DETAILED DESCRIPTION OF THE PREFERRED EMBODIMENTS (First Embodiment)

Figure 1:
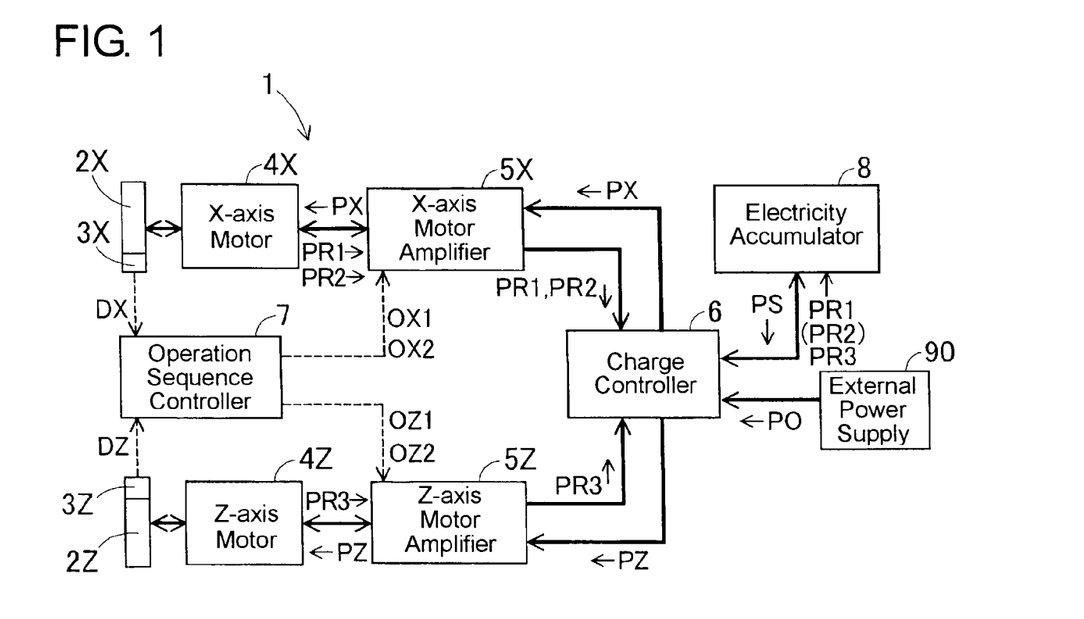
FIG. 1 is a block diagram showing the schematic construction of a component mounting apparatus in a first embodiment according to the present invention.

Hereafter, a component mounting apparatus in a first embodiment according to the present invention will be described with reference to FIGS. 1 to 3. FIG. 1 is a block diagram showing the schematic construction of the component mounting apparatus 1 in the first embodiment. The component mounting apparatus 1 is a machine which performs the mounting of components by moving a component picking member in two orthogonal axis directions in a horizontal plane and a vertical direction. The apparatus 1 is composed of X-axis, Y-axis and Z-axis moving members (hereafter referred to as X-axis to Z-axis moving members and the like), X-axis to Z-axis position detectors, X-axis to Z-axis motors, X-axis to Z-axis motor amplifiers, a charge controller 6, an operation sequence controller 7, an electricity accumulator 8, and so on. In FIG. 1, the Y-axis moving member, the Y-axis position detector, the Y-axis motor, and the Y-axis amplifier are omitted from illustration. In the figure, each thick solid line arrow indicates the flow of electric power (electricity) or motion energy, while each thin broken line arrow indicates the flow of a control command or data. Further, the apparatus 1 is provided with a component picking member, a board transfer device, a component supply device, a base and the like which are all not shown for brevity because they are well-known in the art.

The component picking member is a member which mounts components picked from the component supply device on a board or boards which have been loaded and positioned by the board transfer device, and is generally called "component mounting head" or "fitting head". The direction in which the board transfer device transfers boards is defined as X-axis direction, and the direction which is orthogonal to the X-axis in the horizontal plane is defined as Y-axis. Further, the vertical direction normal to the X-Y plane is defined as Z-axis direction.

The X-axis moving member 2X is a member which is movably interposed between the component picking member and the base for moving the component picking member in the X-axis direction. The X-axis position detector 3X is a device which detects the position of the X-axis moving member 2X, that is, the X-axis position (X-axis moving amount DX) of the component picking member. The X-axis position detector 3X successively detects the X-axis moving amount DX to transmit the same to the operation sequence controller 7. The X-axis motor 4X is a drive source for driving the X-axis moving member 2X and operates as a generator which generates electricity or electric power when the X-axis moving member 2X is decelerated and stopped. That is, the X-axis motor 4X regenerates a motion energy at the time of being reduced in rotational speed to output a regenerative electric power. The X-axis motor amplifier 5X corresponds to a power supply section for the X-axis motor 4X and exchanges electric power with the X-axis motor 4X. That is, the X-axis motor amplifier 5X supplies electric power to the X-axis motor 4X to rotationally drive the same and receives the regenerative electric power when the X-axis motor 4X is decelerated and stopped.

The constructions and functions of those elements which range from the Y-axis moving member to the Y-axis motor amplifier in the Y-axis direction are substantially the same as those aforementioned in the X-axis direction except for being different in the moving direction of the Y-axis moving member, and hence, will be omitted from further description. Further, the constructions and functions of the Z-axis moving member 2Z, the Z-axis position detector 3Z, the Z-axis motor 4Z and the Z-axis motor amplifier 5Z in the Z-axis direction which are all illustrated are also substantially the same as those aforementioned in the X-axis direction except for being different in the moving direction of the Z-axis moving member 2Z and hence, will be omitted from further description.

The charge controller 6 corresponds to a regenerative electric power control section in the claimed invention. The charge controller 6 coordinates the X-axis to Z-axis motor amplifiers 5X to 5Z and is connected also to the electricity accumulator 8 and an external power supply 90. The charge controller 6 has a function of controlling regenerative electric power. Specifically, the charge controller 6 receives a regenerative electric power which is produced when either of the motors 4X to 4Z is decelerated, and supplies the regenerative electric power as a drive electric power to any other motor amplifiers. Further, the charge controller 6 stores in the electricity accumulator 8 a surplus which arises in the regenerative electric power, takes out from the electricity accumulator 8 an electric power amounting to a deficiency which arises in the drive electric power, and receives from the external power supply 90 an electric power amounting to the rest of such a deficiency which still arises.

The operation sequence controller 7 corresponds to a control section in the claimed invention and is configured to control the charge controller 6 as it detects positions of the respective moving members 2X to 2Z. The controller 7 successively receives signals indicative of X-axis to Z-axis moving amounts DX to DZ from the X-axis to Z-axis position detectors 3X to 3Z and is able to detect X-axis to Z-axis direction speeds VX to VZ of the X-axis to Z-axis moving members 2X to 2Z. Further, the controller 7 issues commands to the X-axis to Z-axis motor amplifiers 5X to 5Z to control the supplying of drive electric power and the receipt of regenerative electric power. Thus, the controller 7 also controls the charge controller 6 to receive and supply electric power.

The electricity accumulator 8 corresponds to an electricity accumulation section in the claimed invention and is connected to the charge controller 6 to be able to store electric power. For the electricity accumulator 8, there can be used a condenser which stores electric power in the form of electric energy: for example, an electric double-layer capacitor which is large in electrostatic capacity. Alternatively, for the electricity accumulator 8, there can be used secondary batteries of various types which store electric power in the form converted into chemical energy.

Next, description will be made regarding the operation of the component mounting apparatus 1 as constructed above in the first embodiment. FIG. 2 is an operation chart for schematically explaining an example of an overlap operation performed in the component mounting apparatus 1. In the figure, the axis of abscissas represents. X-axis moving amount DX, and the axis of ordinates represents Z-axis moving amount DZ, wherein an operation profile from a start position P1 to an end position P8 is exemplified. The overlap operation means simultaneous movements in the directions of plural axes, and the operation profile represents the operation locus of the component picking member which is generated by the simultaneous movements. In the example shown therein, the start position P1 of the component picking member is set to a reference position (DX=0) in the X-axis position and a certain height position (DZ=Z1) in the Z-axis direction, while the end position P8 is set to a certain position (DX=X1) in the X-axis direction and a reference height position (DZ=0) in the Z-axis direction. Accordingly, the overlap operation becomes the operation in which the component picking member is moved down in the Z-axis direction as it is moved in the X-axis direction.

Figure 2:
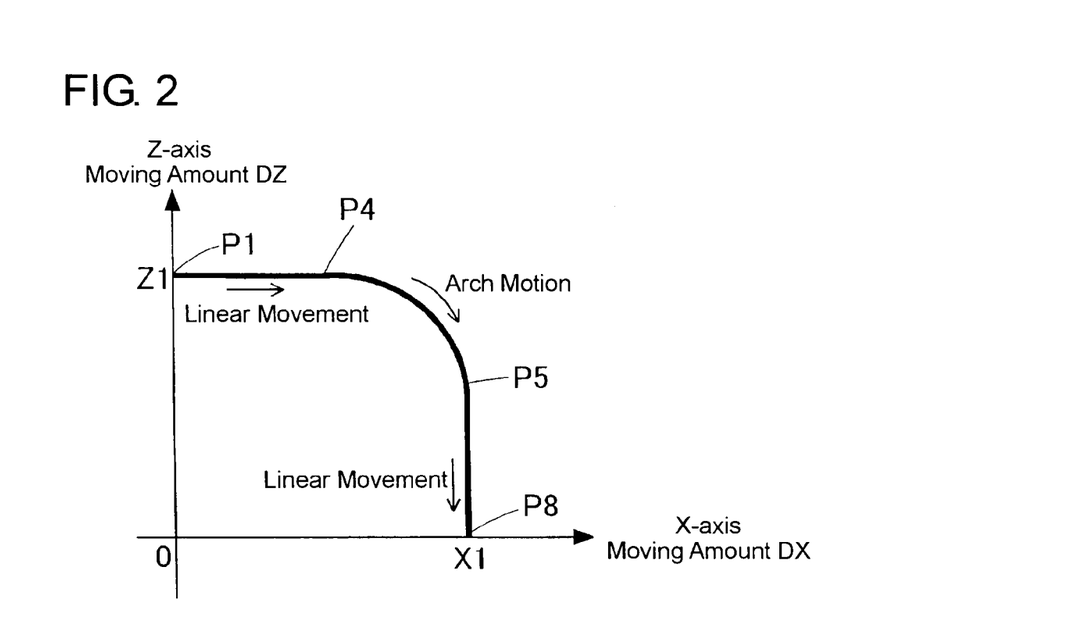
FIG. 2 is an operation chart for schematically explaining an example of an overlap operation performed in the component mounting apparatus in the first embodiment.
Figure 3:
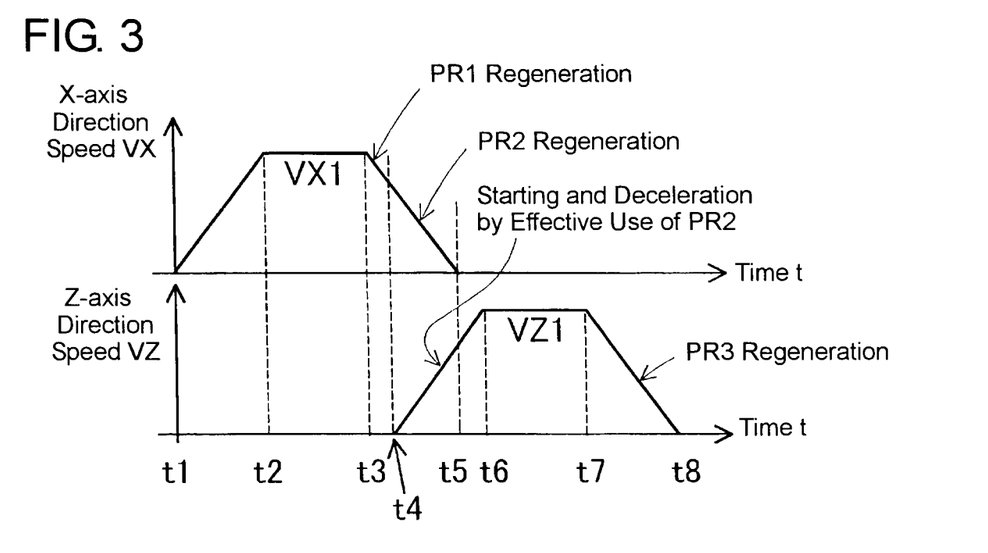
FIG. 3 is a compound time chart for explaining the operation in effective utilization of regenerative electric power in the first embodiment.

FIG. 3 is a compound time chart for explaining the operation in effective utilization of regenerative electric power in the first embodiment and is a chart which schematically illustrates a command sequence for the operation sequence controller 7 to realize the operation profile exemplified in FIG. 2. In the figure, the axis of abscissas represents a common time axis t, the axis of coordinates on the upper stage represents X-axis direction speed VX, and the axis of coordinates on the lower stage represents Z-axis direction speed VZ, wherein indications are made as to the contents of the commands which the operation sequence controller 7 issues to the X-axis and Z-axis motor amplifiers 5X, 5Z. It is assumed that at time t1 in the figure, the component picking member is at the start position P1. Hereafter, description will be made with reference to FIGS. 1 to 3.

When at time t1, the operation sequence controller 7 issues a start command OX1 to the X-axis motor amplifier 5X, the same receives a drive electric power PX from the charge controller 6 and supplies it to the X-axis motor 4X (refer to FIG. 1). Thus, the X-axis motor 4X is started to begin the driving of the X-axis moving member 2X, and the X-axis direction speed VX is gradually accelerated to reach a fixed speed VX1 at time t2 (refer to FIG. 3). The operation sequence controller 7 successively detects the moving in the X-axis direction based on a signal indicative of the X-axis moving amount DX (refer to FIG. 1) which it receives from the X-axis position detector 3X, and commands the X-axis direction speed VX to begin deceleration at time t3 (refer to FIG. 3). Further, the operation sequence controller 7 detects at time t4 that the X-axis moving amount DX has come close to the end position P8 (DX=X1) (refer to FIG. 3), and issues a start command OZ1 to the Z-axis motor amplifier 5Z.

Since during time 1 to time t4, the X-axis moving member 2X is moving but the Z-axis moving member 2Z is held stopped, the operation profile of the component picking member during that time represents a liner locus which extends from the start position P1 to the position P4 in FIG. 2. Further, since the X-axis motor 4X is being decelerated during time t3 to time t4, a regenerative electric power PR1 which is produced by regenerating the motion energy is outputted via the X-axis motor amplifier 5X. The charge controller 6 receives this regenerative electric power PR1 but stores the same in the electricity accumulator 8 because of being unable to make effective use immediately (refer to FIGS. 1 and 3).

The Z-axis motor amplifier 5Z which receives the start command OZ1 at time t4 receives a drive power PZ from the charge controller 6 to supply it to the Z-axis motor 4Z (refer to FIG. 3). Thus, the Z-axis motor 4Z is started to begin the driving of the Z-axis moving member 2Z, whereby the downward Z-axis direction speed VZ is gradually accelerated. On the other hand, when at time t5, the X-axis moving member 2X reaches an X-axis direction position corresponding to the end position P8 (X-axis moving amount DX=X1), the operation sequence controller 7 issues a stop command OX2 to the X-axis motor amplifier 5X. As a result, the X-axis moving member 2X is stopped to make the X-axis direction speed VX zero.

Because during time t4 to time t5, the X-axis moving member 2Z is moved as it is decelerated, at the same time of which the Z-axis moving member 2X is moved as it is accelerated, the operation file of the component picking member draws a curved locus called "arch motion" from the position P4 to the position P5 in FIG. 2. Further, since the X-axis motor 4X is being decelerated during this time, a regenerative electric power PR2 which is produced by regenerating the motion energy is outputted via the X-axis motor amplifier 5X (refer to FIG. 1). On the other hand, the Z-axis motor amplifier 5Z is required to supply the drive electric power PZ to the Z-axis motor 4Z to accelerate the same. Accordingly, the charge controller 6 receives the regenerative electric power PR2 from the X-axis motor amplifier 5X and at the same time, supply the same as a drive electric power PZ to the Z-axis motor amplifier 5Z. At this time, the charge controller 6 stores in the electricity accumulator 8 a surplus arising in the regenerative electric power PR2, but receives the electric power PS stored in the electricity accumulator 8 when a deficiency arises in the drive electric power PZ. When a deficiency still arises, the charge controller 6 receives an external electric power PO from the external power supply 90 (refer to FIG. 1).

After time t5, the Z-axis moving member 2Z only is moved, and the Z-axis direction speed VZ comes to be stable at a fixed speed VZ1 at time t6. The operation sequence controller 7 successively detects the moving downward in the Z-axis direction based on a signal indicative of the Z-axis moving amount DZ (refer to FIG. 1) which it receives from the Z-axis position detector 3Z, and commands the Z-axis direction speed VZ to begin deceleration at time t7 (refer to FIG. 3). Further, when at time t8, the Z-axis moving member 2Z reaches a Z-axis direction position corresponding to the end position P8 (Z-axis moving amount DZ=0), the operation sequence controller 7 issues a stop command OZ2 to the Z-axis motor amplifier 5Z. As a result, the Z-axis moving member 2Z is stopped to make the Z-axis direction speed VZ zero.

Since during time t5 to time t8, the X-axis moving member 2X is held stopped while the Z-axis moving member 2Z only is moved, the operation profile of the component picking member indicates a linear locus which extends from the position P5 to the end position P8 in FIG. 2. Further, since no regenerative electric power is obtained during time t5 to time t7, the drive electric power PZ which drives the Z-axis motor 4Z is supplied from the electricity accumulator 8 or from the external power supply 90 through the charge controller 6. Further, since the Z-axis motor 4Z is being decelerated during time t7 to time t8, a regenerative electric power PR3 which is produced by regenerating the motion energy is outputted via the Z-axis motor amplifier 5Z (refer to FIG. 1). The charge controller 6 receives this regenerative electric power PR3 and stores the same in the electricity accumulator 8 (refer to FIG. 1). Through the foregoing operations, the component picking member is moved from the start position P1 to the end position P8.

The operations illustrated in FIGS. 2 and 3 are only one example wherein the deceleration and stopping in the X-axis direction and the starting and acceleration in the Z-axis direction are performed to overlap, and it is possible to effectively utilize the regenerative electric power by making the application of various overlap operations including the Y-axis direction. Further, the electricity accumulator 8 may be omitted in the first embodiment. In a modified form wherein the electricity accumulator 8 is omitted, electric power cannot be stored, and therefore, it is desirable to provide a regenerative resistance by taking consideration into the situation that a surplus arises in the regenerative electric power (e.g., the regenerative electric powers PR1 and PR3 in the foregoing example).

According to the component mounting apparatus 1 in the first embodiment, where the X-axis moving member 2X and the Z-axis moving member 2Z for example are to perform the overlap operation, the operation sequence controller 7 starts the Z-axis moving member 2Z in synchronized relation with a predetermined timing while the X-axis moving member 2X is being decelerated and stopped, and controls the regenerative electric power PR2 given from the X-axis motor 4X to be utilized for the starting of the Z-axis motor 4Z. Accordingly, the regenerative electric power PR2 which has heretofore been disregarded can be utilized usefully and effectively, so that the electric power consumed by the component mounting apparatus 1 can be reduced.

Further, because of the provision of the electricity accumulator 8, the regenerative electric power PR1 obtained during the movement of the X-axis moving member 2X only, the regenerative electric power PR3 obtained during the movement of the Z-axis moving member 2Z only and the surplus which takes place when the regenerative electric power PR2 is larger than the drive electric power PZ can be stored temporarily and can be effectively utilized later. Further, the generation and utilization of the regenerative electric power are not required to be made at the same time, it is possible to expand the freedom of controlling the moving speeds of the respective moving members.

(Second Embodiment)

Figure 4:
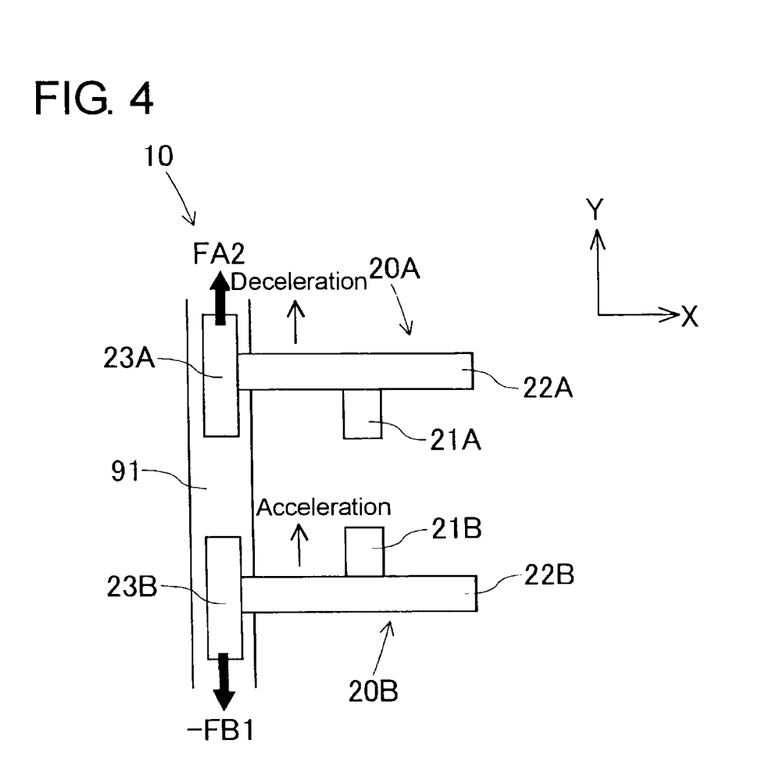
FIG. 4 is a partial schematic plan view for explaining a component mounting apparatus in a second embodiment according to the present invention.

Next, a component mounting apparatus 10 with a plurality of component transfer devices 20A, 20B in a second embodiment will be described with reference to FIGS. 4 and 5. FIG. 4 is a partial schematic plan view for explaining the component mounting apparatus 10 in the second embodiment. The component mounting apparatus 10 in the second embodiment is an apparatus which is provided with a first component component transfer device 20A and a second component transfer device 20B and which simultaneously operate both of the devices 20A, 20B to perform component mounting operations. Besides the first and second component transfer devices 20A, 20B, the apparatus 10 is provided with a charge controller, an operation sequence controller, an electricity accumulator, a board transfer device, a component supply device, a base and the like which are all not shown for brevity and which have functions similar to those in the foregoing first embodiment.

Each of the first and second component transfer devices 20a, 20B is provided with the component picking member, the X-axis to Z-axis moving members, the X-axis to Z-axis position detectors, the X-axis to Z-axis motors and the X-axis to Z-axis motor amplifiers which have all been described in the foregoing first embodiment. For brevity in description, FIG. 4 only shows the component picking member 21A and the Y-axis moving member 22A of the first component transfer device 20A and the component picking member 21B and the Y-axis moving member 22B of the second component transfer device 20B. The component picking member 21A of the first component transfer device 20A is held on the Y-axis moving member 22A and is movable in the X-axis direction. The Y-axis moving member 22A has a sliding part 23A on the left side in the figure, and the sliding part 23A is slidably held by a stationary rail 91 extending in the Y-axis direction. The stationary rail 91 is a part of the base, and the Y-axis moving member 22A is movable on the base in the Y-axis direction. The component picking member 21A of the first component transfer device 20A is configured to be driven by the X-axis to Z-axis motors.

Likewise, the component picking member 21B of the second component transfer device 20B is held on the Y-axis moving member 22B and is movable in the X-axis direction. The Y-axis moving member 22B has a sliding part 23B on the left side in the figure, and the sliding part 23B is slidably held by the stationary rail 91. The Y-axis moving member 22B is movable on the base in the Y-axis direction. The component picking member 21 B of the second component transfer device 20B is configured to be driven by the X-axis to Z-axis motors.

The six motors in total which are equipped on the first and second component transfer devices 20A, 20B are respectively provided with motor amplifiers constituting power supply sections therefor. A charge controller corresponding to the aforementioned regenerative electric power control section coordinates the six motor amplifiers and is connected also to the electricity accumulator and an external power supply to have a function of controlling regenerative electric power. An operation sequence controller corresponding to the aforementioned control section is configured to control the charge controller as it detects positions of the six moving members. The electricity accumulator corresponding to the aforementioned electricity accumulation section is connected to the charge controller to be able to store electric power.

Next, the operation of the component mounting apparatus 10 as constructed above in the second embodiment will be described primarily in the respect that differs from the first embodiment. In the second embodiment, where the two Y-axis moving members 22A, 22B are moved, the operation sequence controller when detecting the beginning to decelerate and stop one of the Y-axis moving members 22A, 22B begins to start and accelerate the other Y-axis moving member and performs a control to utilize the regenerative electric power obtained from one of the motors which is driving the one Y-axis moving member 22A, 22B, in starting the other motor which is about to drive the other Y-axis moving member. FIG. 5 is a compound time chart for explaining operations which are executed for the effective utilization of regenerative electric power and the suppression of vibration in the second embodiment, and is a chart schematically showing a command sequence of the operation sequence controller. In the figure, the axes of abscissas represent common time axes t, and the axes of coordinates on the upper stage (A) represent the Y-axis direction speed VA of the Y-axis moving member 22A in the first component transfer device 20A, the drive or regenerative electric power PA and the reaction force FA exerted on the base. Further, the axes of coordinates on the middle stage (B) represent the Y-axis direction speed VB of the Y-axis moving member 22B in the second component transfer device 20B, the drive or regenerative electric power PB and the reaction force FB exerted on the base, and the axis of coordinates on the lower stage (C) represents the total reaction force FT exerted on the base.

Figure 5:
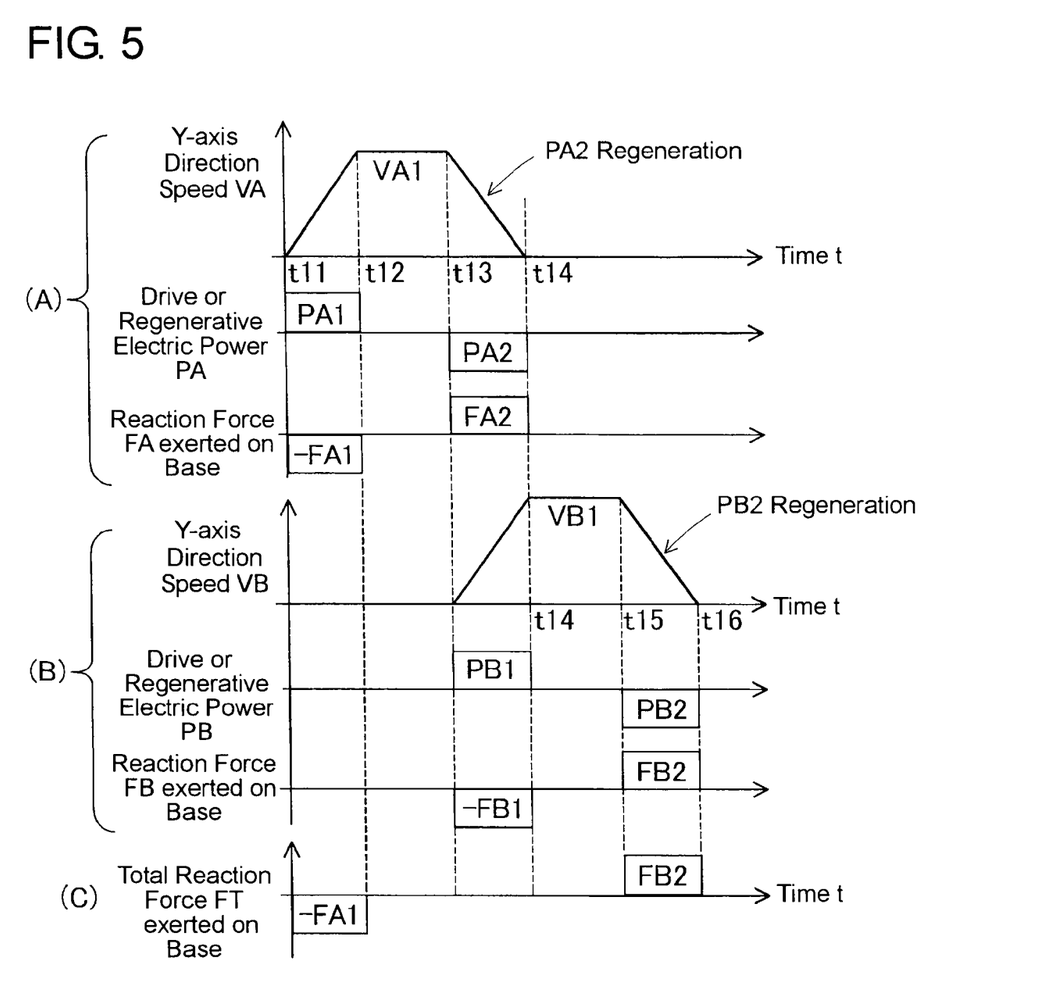
FIG. 5 is a compound time chart for explaining the effective utilization of regenerative electric power and the suppression of vibration in the second embodiment.

In FIG. 5, when the operation sequence controller issues a start command to the first component transfer device 20A at time t11. Then, the Y-axis moving member 22A of the first component transfer device 20A begins a starting operation and is accelerated while consuming a drive electric power PA1 until the Y-axis direction speed VA becomes stable at a fixed speed VA1 at time t12. During this period, the Y-axis moving member 22A is being accelerated in the Y-axis positive-going direction, whereby a reaction force—FA1 in the Y-axis negative-going direction is exerted on the stationary rail 91.

Subsequently, at time t13, the operation sequence controller issues a deceleration command to the first component transfer device 20A and at the same time, issues a starting command to the second component transfer device 20B. Further, until time t14 is reached, the operation sequence controller performs a harmonization control so that the deceleration of the first component transfer device 20A and the acceleration of the second component transfer device 20B become approximately equal amounts or strengths with opposite signs of plus and minus (i.e., in the opposite directions). Thus, the Y-axis moving member 22A of the first component transfer device 20A is decelerated and is stopped at time t14. During this period, a regenerative electric power PA2 is generated, and a reaction force FA2 in the Y-axis positive-going direction is exerted on the stationary rail 91. On the other hand, the Y-axis moving member 22B of the second component transfer device 20B is started and is accelerated while consuming a drive electric power PB1 until the Y-axis direction speed VB becomes stable at a fixed speed VB1 at time t14. During this period, the Y-axis moving member 22B is accelerated in the Y-axis positive-going direction, whereby a reaction force—FB1 in the Y-axis negative-going direction is exerted on the stationary rail 91.

During time t13 to time t14, the charge controller receives the regenerative electric power PA2 from the first component transfer device 20A and at the same time, supplies it as the drive electric power PB1 for the second component transfer device 20B. At this time, since the deceleration of the former and the acceleration of the latter are approximately equal amounts or strengths with opposite signs of plus and minus, it is possible to immediately effectively utilize the most part of the regenerative electric power PA2 for the drive electric power PB1. Accordingly, the loss which would otherwise occur in storing a surplus regenerative electric power and thereafter in taking out the same can be reduced as little as possible, so that the efficiency in utilizing regenerative electric power can be enhanced remarkably.

Further, the respective reaction forces FA, FB which the first and second component transfer devices 20A, 20B exert on the stationary rail 91, that is, on the base can be calculated as the projects of the masses of the respective Y-axis moving members 22A, 22B and the accelerations. Here, the two Y-axis moving members 22A, 22B are the same in construction and have the same masses. Accordingly, the reaction force FA2 in the Y-axis positive-going direction which is exerted by the first component transfer device 20A during time t13 to time t14, and the reaction force—FB1 in the Y-axis negative-going direction which is exerted by the second component transfer device 20B during the same period become approximately equal amounts or strengths with opposite signs of plus and minus. Therefore, as shown on the lower stage (C) in FIG. 5, the total reaction force FT which acts on the stationary rail 91, that is, on the base becomes almost null as a result of the reaction force FA2 offset by the reaction force—FB1. In other words, it is possible to substantially suppress the vibration which would otherwise be generated on the base.

Thereafter, at time t15, the operation sequence controller issues a deceleration command to the second component transfer device 20B. Then, the Y-axis moving member 22B of the second component transfer device 20B is decelerated and is stopped at time t16. During this period, a regenerative electric power PB2 is produced, and a reaction force FB2 in the Y-axis positive-going direction is exerted on the stationary rail 91. The charge controller stores in the electricity accumulator the regenerative electric power PB2 that cannot be effectively utilized immediately.

The operation sequence which controls movements in the same direction to make one follow the other as described in FIGS. 4 and 5 often takes place in the component mounting apparatus 10 wherein the component picking members 21A, 21B are arranged in a face-to-face relation. For example, let it be now assumed that there is an interference area where the scheduled moving areas of the two component picking members 21A, 21B overlaps partly or wholly and that one of them goes out the interference area in place of which the other goes into the interference area. In this situation, where a control is performed so that at the same time as the one picking member is decelerated to be stopped outside the interference area, the other picking member is started and accelerated to advance into the interference area, advantageous effects can be attained in both respects including the effective utilization of regenerative electric power and the suppression of vibration. Particularly, in recent years, there is a tendency to increase the moving speed, to shorten the time length for fixed speed and to increase the time lengths for acceleration and deceleration. In the example shown in FIG. 5, the period of time t12 to time t13 for the fixed speed VA1 and the period of time t14 to time t15 for the fixed speed VB1 are shortened, whereas the time lengths for acceleration and deceleration such as the period of time t13 to time t14 are increased. Accordingly, the advantages become remarkable because of increases in the effective utilization of regenerative electric power as well as in the time length taken to suppress vibration.

(Third Embodiment)

Figure 6:
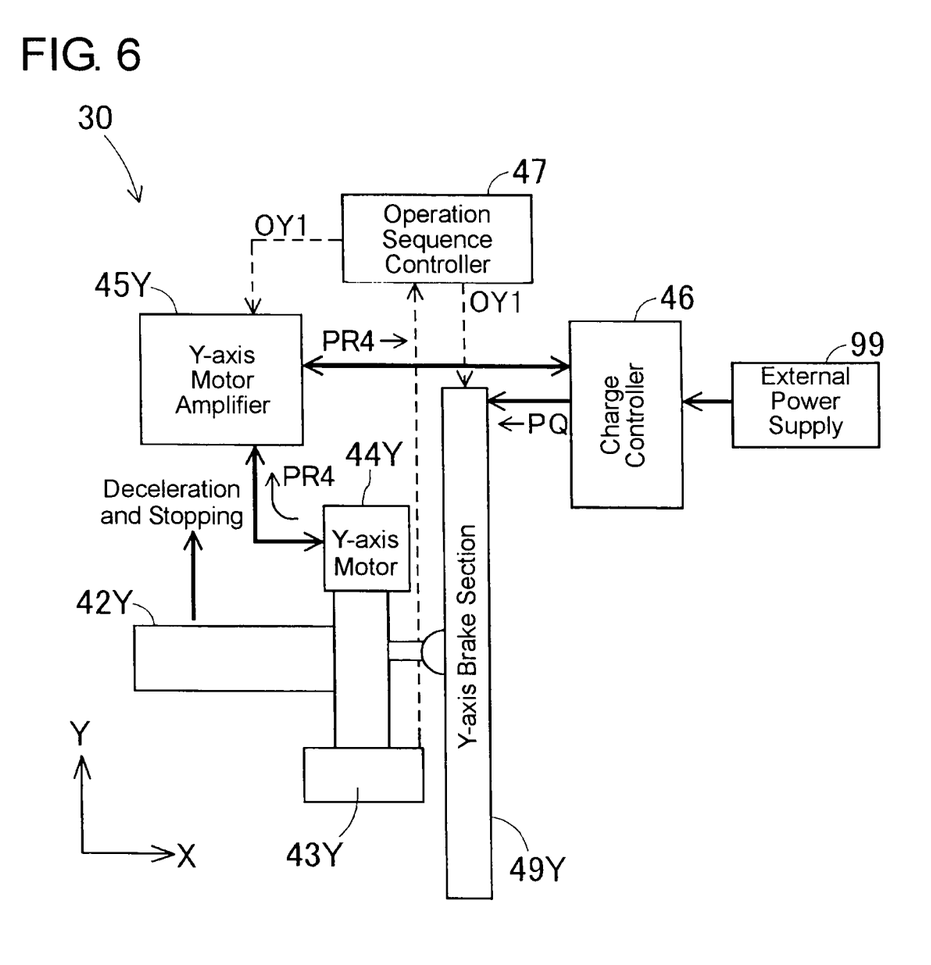
FIG. 6 is a block diagram showing the schematic construction of a component mounting apparatus in a third embodiment according to the present invention.

Next, a component mounting apparatus 30 with brake sections operated by electric power in a third embodiment will be described with reference to FIG. 6. FIG. 6 is a block diagram showing the schematic construction of the component mounting apparatus 30 in the third embodiment. The component mounting apparatus 30 in the third embodiment is provided with the component picking member, the X-axis to Z-axis moving members, the X-axis to Z-axis position detectors, the X-axis to Z-axis motors and the X-axis to Z-axis motor amplifiers, which have all been described in the foregoing first embodiment, and is further provided with X-axis to Z-axis brake sections. Furthermore, the component mounting apparatus 30 is also provided with a charge controller 46, an operation sequence controller 47, a board transfer device, a component supply device and a base which are all similar in function to those in the foregoing first and second embodiments. For brevity in description, FIG. 6 only shows the Y-axis moving member 42Y, the Y-axis position detector 43Y, the Y-axis motor 44Y, the Y-axis motor amplifier 45Y and the Y-axis brake section 49Y.

The three brake sections inclusive of the Y-axis brake section 49Y are operated by electric power to brake the X-axis to Z-axis moving members 42Y and are constituted by using an electro rheological fluid. The electro rheological fluid is a fluid which is increased in viscosity when having a voltage applied thereto, and is able to utilize the increase in viscosity for brake force. Alternatively, the brake sections may be of the type that is constituted by using a magnetic fluid to be operated by electric power. The magnetic fluid is a fluid which has a property of being magnetized though being fluid and of being attracted to a magnet as iron sand is done, and thus, it is possible to utilize an electromagnetic force for a brake force.

The charge controller 46 corresponding to the aforementioned regenerative electric power control section coordinates the X-axis to Z-axis motor amplifiers 45Y and the X-axis to Z-axis brake sections 49Y and is connected to an external power supply 99 to perform a function of controlling regenerative electric power. The sequence controller 47 corresponding to the aforementioned control section is configured to control the charge controller 46 as it detects the movements of the three moving members 42Y.

Next, description will be made regarding the component mounting apparatus 30 as constructed above in the third embodiment. In FIG. 6, when detecting the beginning to decelerate and stop the Y-axis moving member 42Y, the operation sequence controller 47 begins the operation of the Y-axis brake section 49Y and controls the charge controller 46 to utilize a regenerative electric power obtained from the Y-axis motor 44Y for the operation of the Y-axis brake section 49Y.

Specifically, when a deceleration is required in the movement of the Y-axis moving member 42Y in the Y-axis direction, the operation sequence controller 47 issues a deceleration command OY1 to the Y-axis motor amplifier 45Y and the Y-axis brake section 49Y. Then, the Y-axis brake section 49Y receives a brake electric power PQ from the charge controller 46 and starts the brake operation. As the Y-axis moving member 42Y begins to be decelerated, a regenerative electric power PR4 which is produced by regenerating the motion energy is outputted via the Y-axis motor amplifier 45Y. The charge controller 46 receives the regenerative electric power PR4 from the Y-axis motor amplifier 45Y and at the same time, supplies the regenerative electric power PR4 to be fed back as the brake electric power PQ to the Y-axis brake section 49Y. The operation sequence controller 47 also controls the electric power received and supplied by the charge controller 46 as a result of controlling the Y-axis motor amplifier 45Y and Y-axis brake section 49Y.

According to the component mounting apparatus 30 in the third embodiment, the regenerative brake force PR4 which is obtained at the time of the deceleration and stopping of the Y-axis moving member 42Y can be effectively utilized by being fed back for the operation of the Y-axis brake section 49Y, so that the electric power consumption in the component mounting apparatus 30 can be reduced in comparison with that in the prior art apparatus. In addition, by the action of the electro rheological fluid which is stimulated in the Y-axis brake section 49Y, it is possible to decelerate and stop the Y-axis moving member 42Y powerfully and efficiently.

Although in each of the foregoing embodiments, the charge controller 6, 46 coordinates the respective motor amplifiers 5X, 5Z, 45Y of the X-axis to Z-axis motors 4X, 4Z, 44Y, it may also coordinate other motor amplifiers equipped in the component mounting apparatus 1, 10, 30. For example, by the coordination of a motor amplifier for a transfer drive motor in the board transfer device, there can be made a construction that interchanges electric power between those amplifiers coordinated with one another. Besides, various applications and modifications are possible in the present invention.

Obviously, numerous further modifications and variations of the present invention are possible in light of the above teachings. It is therefore to be understood that within the scope of the appended claims, the present invention may be practiced otherwise than as specifically described herein.

What is claimed is:

1. A component mounting apparatus which has a plurality of moving members respectively driven by motors for performing a component mounting operation, the apparatus comprising:

a regenerative electric power control section for controlling regenerative electric power which is produced by regenerating a motion energy when each of the electric motors is decelerated;

power supply sections for the respective motors each for exchanging electric power with the regenerative electric power control section; and a control section being operable where two moving members of the plurality of moving members are moved, for beginning to start and accelerate one of the two moving members in synchronized relation with a timing of beginning to decelerate and stop the other moving member or with a predetermined timing in the deceleration of the other moving member and for controlling the regenerative electric power control section to utilize a regenerative electric power which is obtained from the motor driving the other moving member at the time of the deceleration, in starting the motor which drives the one moving member so as to start and accelerate the one moving member.

2. The component mounting apparatus as set forth in claim 1, wherein the control section performs a harmonization control to synchronize the deceleration timing of the other moving member with the acceleration timing of the one moving member or to make the deceleration of the other moving member and the acceleration of the one moving member become approximately equal strengths with opposite signs of plus and minus.

3. The component mounting apparatus as set forth in claim 2, further comprising an electricity accumulation section connected to the regenerative electric power control section and being capable of storing the electric power.

4. The component mounting apparatus as set forth in claim 1, further comprising an electricity accumulation section connected to the regenerative electric power control section and being capable of storing the electric power.

* * * * *